United States Patent [19]

Ernsberger

[11] 4,144,066
[45] Mar. 13, 1979

[54] ELECTRON BOMBARDMENT METHOD FOR MAKING STAINED GLASS PHOTOMASKS

[75] Inventor: Fred M. Ernsberger, Pittsburgh, Pa.

[73] Assignee: PPG Industries, Inc., Pittsburgh, Pa.

[21] Appl. No.: 856,063

[22] Filed: Nov. 30, 1977

[51] Int. Cl.² ........................... G03C 5/08; B05D 3/06
[52] U.S. Cl. ..................................... 96/35.1; 65/30 E;
96/36.2; 427/42; 427/43; 427/300; 428/38
[58] Field of Search ..................... 427/42, 43, 36, 444,
427/300, 372 R, 376 A; 96/35.1, 36.2; 428/38;
65/30 E

[56] References Cited

U.S. PATENT DOCUMENTS

| 3,484,263 | 12/1969 | Kushihashi et al. | 427/42 |
|---|---|---|---|
| 3,515,587 | 6/1970 | Letter | 427/43 X |
| 3,516,855 | 6/1970 | Goll et al. | 427/43 |
| 3,528,847 | 9/1970 | Grego et al. | 65/30 E |
| 3,585,091 | 6/1971 | Lepselter | 427/43 X |
| 3,837,884 | 9/1974 | Rheinberger | 427/42 X |
| 3,864,194 | 2/1975 | Shibata et al. | 428/38 |
| 3,994,727 | 11/1976 | Polichette et al. | 427/42 X |

*Primary Examiner*—Ronald H. Smith
*Assistant Examiner*—Thurman K. Page
*Attorney, Agent, or Firm*—Dennis G. Millman

[57] ABSTRACT

Glass photomasks having a stained pattern within the glass for use in photolithographic processes are made by injecting stain-producing ions, preferably silver and/or copper ions, into a glass substrate from a film by electron bombardment, which also serves to reduce the injected ions to their elemental state and to agglomerate the atoms to colloidal coloration centers. The stained areas of the glass are patterned by carrying out the electron bombardment through a developed photoresist, or by using a focused electron beam moving along a controlled locus.

5 Claims, 3 Drawing Figures

ELECTRON BOMBARDMENT METHOD FOR MAKING STAINED GLASS PHOTOMASKS

BACKGROUND OF THE INVENTION

Photomasks are used in the art of photolithography for printing microelectronic circuits and other precision photofabricated parts, such as television shadow masks. In a photolithographic process a substrate is covered with a layer of photoresist in which a pattern is photographically developed by superimposing over the photoresist a photomask having patterned transparent and opaque areas, and then passing actinic radiation, especially ultraviolet light, through the transparent areas of the photomask. A pattern is then developed in the photoresist as a relief image by means of the differential solubilities of the exposed and unexposed portions. The resulting image may be either a negative or a positive image of the photomask, depending upon whether the photoresist is "negative-working" or "positive-working." Etching or other treatments may then be carried out on the underlying exposed portions of the substrate. A general discussion of the state of the art of photofabrication and the role played by photomasks may be found in *Scientific American*, September 1977, pages 111-128.

Since the preparation of a photomask can be laborious and costly, it is desirable for each photomask to be reused many times in the manufacture of photofabricated devices. Therefore, a photomask should be sufficiently durable to withstand extensive use, handling, and occasional cleaning without damage to the precision pattern it carries. It is also highly desirable to maximize the resolution of the pattern carried by a photomask so as to improve the accuracy of the image it imparts to the photofabricated devices being manufactured, which in turn permits further miniaturization of microcircuits and the like.

Photomasks in the prior art have typically consisted of sheets of glass carrying patterned coatings on their surfaces. Photographic emulsion, iron oxide, and chromium are the films most commonly used. While iron oxide and chromium are considerably more durable than photographic emulsion coatings, all three, by their very nature as coatings, are susceptible to scratching and other damage which shortens the useful life of the photomasks. Also, the etching required to produce a desired pattern in iron oxide or chromium films entails a loss of resolution due to the so-called "etch factor," which means that an etched groove grows wider as it grows deeper. This may be lessened by reducing the film thickness, but with a sacrifice in durability. Moreover, chromium films have the drawbacks of being opaque, which is a disadvantage when aligning the photomask with the substrate being processed, and of being reflective, which causes undesirable light scattering.

Photomasks of improved durability were proposed in U.S. Pat. No. 3,573,948 to M. S. Tarnopol and U.S. Pat. No. 3,732,792 M. S. Tarnopol et al., wherein instead of a coating on the surface of a glass sheet, the opaque areas of the photomask are produced by a stained pattern within the glass. While such stained glass photomasks represent a great improvement in durability, the degree of pattern resolution is less than what is desired for some applications. The limited resolution of the stained masks of the aforementioned patents arises from the necessity in one case to deeply etch the pattern through a stained layer of the glass, and in the other case to etch through a difficult-to-remove tin oxide coating, as well the tendency in both cases for a thermally migrated stain to spread laterally from the stained areas into the adjacent unstained areas during the staining process. A stained glass photomask is also shown in U.S. Pat. No. 3,561,963 to W. M. Kiba, where the desired pattern is etched into a copper film on the glass substrate and copper ions are then migrated into the glass by heating. In U.S. Pat. No. 3,933,609 to J. S. Bokov et al. the photomask is made by staining the entire surface of a sheet of glass and then selectively etching away portions of the stained layer.

Attempts to minimize lateral diffusion of the staining ions within the glass are disclosed in U.S. Pat. Nos. 2,927,042 to A. J. C. Hall et al. and 3,620,795 to W. M. Kiba. In those patents, a film of a stain-producing metal is deposited onto the glass and patterned portions of the film are removed by photoetching. Ions from the remaining patterned film are then migrated into the glass to produce stained areas by applying an electric field through the glass in the desired direction of ion migration while maintaining the glass at an elevated temperature. Since resolution is reduced each time the pattern is transferred to a different material, it would be highly desirable to reduce the number of steps required for such processes.

The use of electron bombardment to reduce stain-producing ions within glass to their elemental state was known in the prior art. For example, see *Coloured Glasses* by W. A. Weyl, Society of Glass Technology, Sheffield, England (1951), page 417. Some coloration affects of electron bombardment on some of the normal constituents of various glass compositions are disclosed in Reports of the Research Laboratory of Asahi Glass Company, Ltd., 25 1 (1975), pages 51 through 58. Also, the use of electron beams to produce coloration within films carried by glass substrates are disclosed in U.S. Pat. No. 3,720,515 to Stanley and U.S. Pat. No. 3,515,587 to Letter. An article by J. L. Lineweaver in *J. Applied Physics*, Vol. 34, p. 1786 (1963) discusses some coloration effects caused by sodium reduction in glass induced by electron bombardment. However, none of these references deal with injecting stain-producing ions into glass.

SUMMARY OF THE INVENTION

It has now been found that stain-producing ions such as copper and/or silver can be injected into a surface portion of a glass substrate by means of electron bombardment through a thin film of a source of the stain-producing ion. The electron bombardment causes the injected ions to immediately become reduced to their elemental state, whereupon the application of heat causes the atoms to agglomerate into colloidal microcrystalline color centers which result in the formation of a stain within the body of the glass substrate. The agglomerating heat may be applied by the electron beam itself or by auxiliary means. The stain may be generated in the pattern desired for a photomask either by employing a photoresist through which the electron bombardment may be carried out or by scanning a focused electron beam along a controlled locus.

The Drawings

Figure 1A:
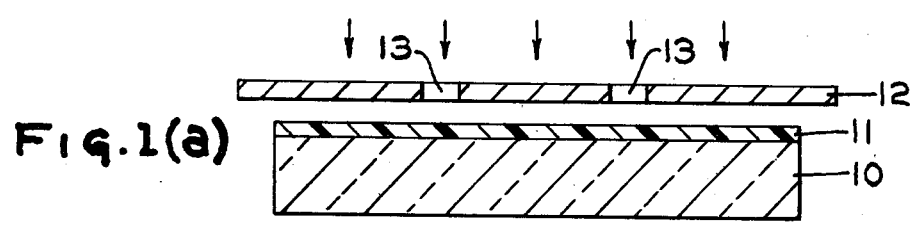
FIG. 1 (*a* through *d*) shows schematically a series of process steps in a preferred embodiment of the present invention wherein electron bombardment takes place through a metal film applied over a photoresist.

It should be understood that thicknesses have been greatly exaggerated in some cases in the drawings for the purpose of illustration.

Detailed Description

Creating a stain within a glass substrate entails three distinct steps: (1) stain-producing cations are migrated into the glass where they take the place of mobile cation constituents of the glass, particularly alkali metal ions such as sodium and/or potassium, then (2) the migrated stain-producing cations are reduced to their atomic state, and (3) the atoms are agglomerated into colloidal microcrystalline color centers. By the present invention, at least the first two processes, and optionally the third as well, are carried out simultaneously by electron bombardment. It has been found that when a thin conductive film containing a source of stain-producing ions on a glass substrate is bombarded with electrons of sufficient energy, some of the electrons will pass through the film and become lodged within the glass. An accumulation of these electrons within the surface portion of the glass creates a charge imbalance which acts as a cathode to draw stain-producing ions from said film into the glass. Due to the presence of excess electrons in the surface portion of the glass, the stain-producing cations which migrate into the glass are immediately reduced to their atomic state. Depending upon the power output of the electron beam, sufficient thermal energy may be generated within the glass by the electron bombardment to also agglomerate the stain-producing atoms. Otherwise, a separate source of heat may be provided to carry out the agglomeration process. A better understanding of the invention may be obtained from the following detailed description of several particular embodiments of the present invention.

In FIG. 1 there is depicted a preferred embodiment of the present invention. In the first step of the process as shown in FIG. 1(a), a glass substrate 10, such as a sheet of conventional soda-lime-silica glass, has a photoresist layer 11 applied to one surface thereof. The type of glass used is not particularly critical, so long as it includes at least a small amount of mobile cations such as alkali metal ions.

Figure 1B:
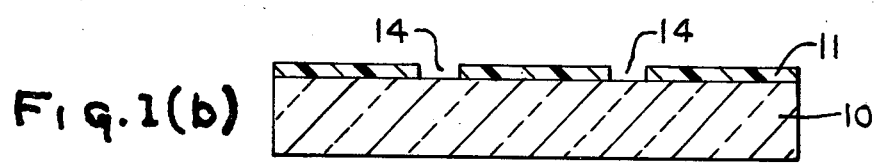

Photoresists are well known in the art and need not be discussed at great length here for an understanding of the present invention. In general, however, a photoresist may be defined as a resinous material which, upon exposure to actinic radiation (usually ultraviolet light), develops areas insoluble in a particular solvent and other areas which are soluble in that solvent. A detailed discussion of photoresists may be found in *Annual Review of Materials Science*, 1976, edited by Huggins, Bube, and Roberts, Volume 6, pages 267 through 302, which is hereby incorporated by reference. A wide variety of commercially available photoresists are suitable for use with the present invention, although those with higher temperature stability may be preferred. The photoresist shown in FIG. 1 is a positive-working photoresist, but it should be understood that negative-working photoresists are equally suitable. The photoresist 11 is exposed to ultraviolet radiation through a master mask 12 having patterned apertures 13. Upon development of the photoresist, patterned openings 14 are produced therein, as shown in FIG. 1(b).

Next, a thin conductive film 15 containing a source of stain-producing cations is deposited over the developed photoresist. Film 15 may be a metal or a metal oxide or salt, and the stain-producing ions are preferably silver and/or copper although gold and thallium may also be employed. Preferably, film 15 is a metallic film of silver deposited by sputtering or evaporation. The thickness of film 15 should be sufficient to provide at least the required amount of stain-producing cations, although its thickness is preferably minimized so as to minimize the voltage requirements for the subsequent electron bombardment step.

Figure 1C:
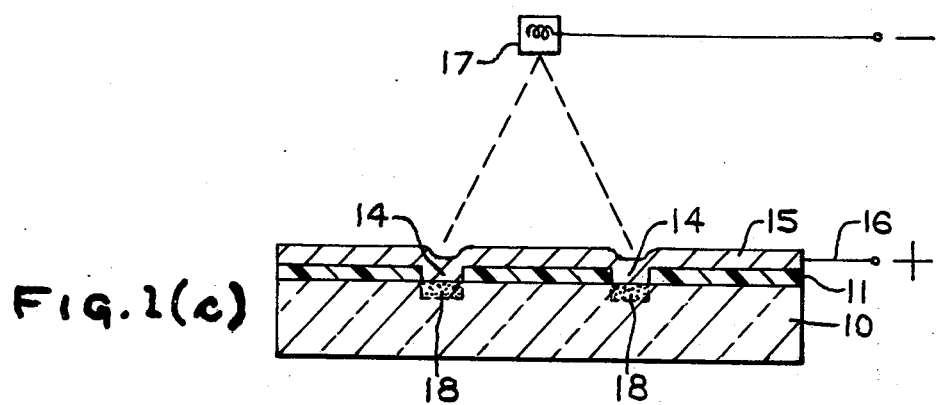

Referring now to FIG. 1(c) the electron bombardment step shown there takes place in an evacuated chamber. Film 15 is connected as the anode by means of lead 16 to establish an electrical field between the film 15 and a source of electrons 17. Film 15 is uniformly flooded with electrons from source 17 with sufficient energy for at least some of the electrons to penetrate through the thickness of film 15 and into the underlying glass. The energy level of electrons will depend upon a number of factors including the thickness of film 15, the depth of electron penetration desired, and the degree of temperature rise desired to be generated in the surface portions of the glass. Voltages on the order of at least about 5 to 10 kilovolts have been found sufficient for most purposes. Electron penetration of about one micron has been found to result from the use of about 10 kilovolts. In zones 18 of the glass underlying the patterned openings 14 through the photoresist, electron penetration establishes a localized negative charge within those zones which induces migration of the stain-producing cations from film 15 into the glass. The remaining portions of photoresist 11 mask ion migration in the other areas of the glass surface. Because of the availability of excess electrons, reduction of the injected cations takes place immediately within zones 18, and if the heating effect of the electron beam is sufficiently intense, agglomeration of the atoms will also take place simultaneously. However, if a lower energy electron beam is employed, agglomeration may be carried out by heating the glass substrate 10 from an independent source of heat. This independent source of heat may be located within the vacuum chamber so that heating may take place simultaneously with the electron bombardment, or the agglomeration heating may take place in a separate, subsequent operation outside the vacuum chamber.

Figure 1D:
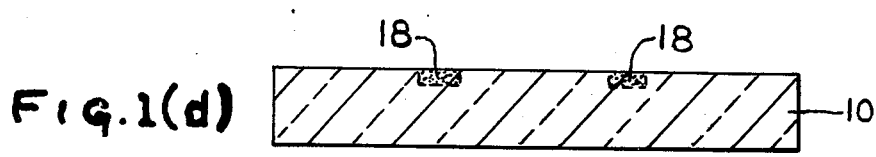

Upon removal of the photoresist 11 and film 15, the final product as shown in FIG. 1(d) is an all-glass photomask having a pattern of stained areas 18 within the glass. The opacity of the stained areas is determined by the amount of stain-producing ion injected into the glass, which in turn is controlled by the length and conditions of the electron bombardment step. Typically, glass stains of the type disclosed here can readily achieve a transmittance of less than 1% in the ultraviolet range of wavelengths (3,000 to 4,000 Angstroms) most commonly used in photolithographic processes. At the same time, these same areas remain sufficiently transparent in the visible wavelength spectrum to advantageously provide enough transparency to enable an operator to align the photomask with a substrate to be printed. The unstained areas of the photomask retain the radiation transmittance properties of the base glass from which the substrate 10 is made, which may typically be at least an order of magnitude more transparent than the stained areas in the ultraviolet range.

The process of FIG. 2 is essentially the same as that of FIG. 1, but illustrates several alternate techniques for carrying out the process steps. As shown in FIG. 2(a), a glass substrate 20 has a thin film source of stain-producing ions deposited upon one of its surfaces prior to application of a photoresist, the reverse order of the FIG. 1 process. In FIG. 2(b), the opposite side of glass substrate 20 has been coated with an electroconductive film 22 to serve as the anode in the electron bombardment step. A photoresist layer 23 is then applied over the ion source film 21 and exposed and developed so as to provide a pattern of apertures 24 as shown in FIG. 2(c). The thickness of the photoresist layer 23 in this embodiment must be sufficient to prevent electrons from penetrating to the ion source layer 21 during the electron bombardment step. This thickness will depend upon the particular photoresist being used and the energy level of the electron beam.

Figure 2A:
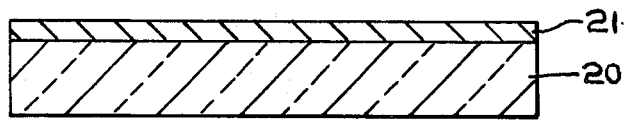
FIG. 2 (a through 3) shows schematically a series of process steps in a variation of the FIG. 1 embodiment wherein photoresist is applied over a metal film on the glass substrate.
Figure 2B:
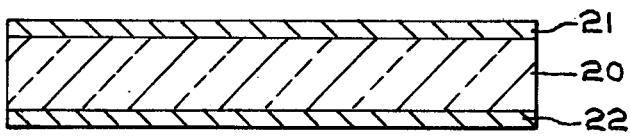
Figure 2C:
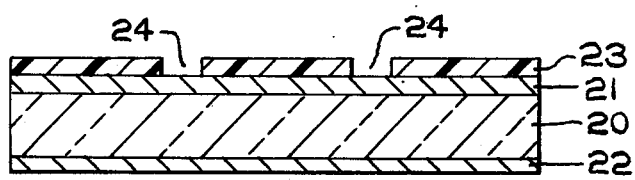
Figure 2D:
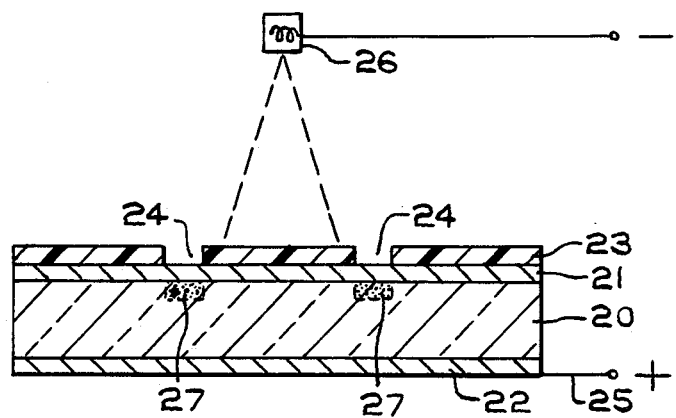
Figure 2E:
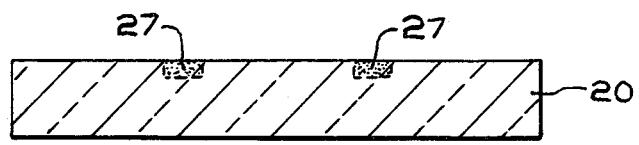

Referring now to FIG. 2(d), conductive film 22 on the underside of glass substrate is connected as the anode by means of electrical lead 25. Electron source 26 directs high voltage electrons at the photoresist side of the substrate, thereby causing migration of stain-producing ions from film 21 into surface zones 27 of the glass which underlie the openings 24 in the photoresist 23. As in the previous embodiment, these injected ions are immediately reduced by the electrons and may also be agglomerated depending upon the temperature to which the glass surface is raised by the electron bombardment. Auxiliary heat may be applied if necessary to agglomerate the staining atoms in the zones 27. Upon removal of the films, the final product is an all-glass photomask having a pattern of stained zones 27 as shown in FIG. 2(e).

Figure 3A:
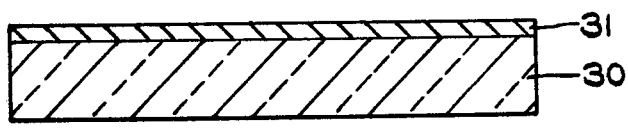
FIG. 3 (a through c) shows schematically a series of process steps in an alternate embodiment of the present invention wherein a scanning, focused electron beam creates a pattern within a glass substrate.
Figure 3B:
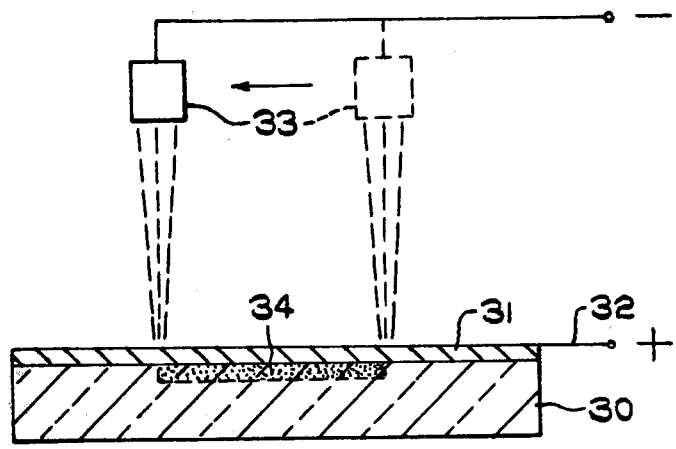
Figure 3C:
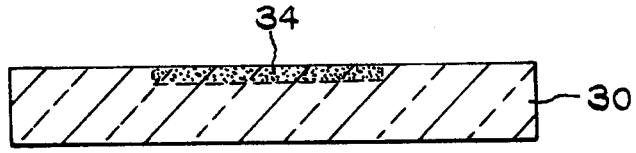

FIG. 3 depicts another alternate embodiment of the invention in which a photoresist is not employed, but rather a scanning, focused electron beam is used to generate the desired stain pattern for the photomask. The first step of the process as shown in FIG. 3(a) is to deposit onto a glass substrate 30 a thin film 31 of a source of stain-producing ions. FIG. 3(b) depicts the electron bombardment step which takes place in an evacuated chamber. Film 31 is connected as the anode by way of electrical lead 52. A focused electron beam generator 33 scans over the coated side of the glass along a controlled locus, injecting stain-producing ions from the film 31 into the glass as it travels. Instead of mechanically translating the electron beam it is also possible to scan the electron beam electronically. In either case, the path of the electron beam may be automatically controlled, such as by a computer. The overall effect is to "write" the desired stain image into the glass surface portion 34. The injected ions in zone 34 are simultaneously reduced by the electron beam and may also be agglomerated depending upon the temperature generated by the electron beam. Film 31 may then be stripped and auxiliary heat applied if necessary for agglomeration, thereby yielding the photomask shown in FIG. 3(c).

Other modifications and variations as are known to those of skill in the art may be resorted to without departing from the spirit and scope of the invention as defined by the appended claims.

I claim:

1. A method for making stained glass photomasks comprising:
    placing a thin film source of stain-producing cations into contact with at least selected areas of a surface of a glass substrate;
    bombarding the film with electrons of sufficient energy to penetrate through the film and into the glass so as to inject stain-producing cations into the glass underlying said selected areas of the glass substrate surface, and to reduce the injected cations to their atomic state, while adjacent areas of said glass surface are maintained essentially free from injected cations;
    removing said thin film source from the surface of the glass; and
    heating the glass substrate to agglomerate the injected stain-producing atoms within the glass into colloidal coloration centers, thereby producing a contrasting pattern of stained radiation absorbing zones and non-stained essentially transparent zones within the glass substrate.

2. The method of claim 1, further including the steps of applying a layer of photoresist onto the surface of the glass substrate and photographically developing the photoresist to provide patterned openings through the photoresist which overlie said selected areas of the glass surface before depositing said cation source film.

3. The method of claim 1, wherein said cation source film is placed into contact with the whole of said glass surface and a layer of photoresist is applied over the cation source film and is photographically developed to provide patterned openings through the photoresist which overlie said selected areas of the glass surface.

4. The method of claim 1 wherein the electron bombardment is directed toward said film as a focused beam, the impingement of which is limited to portions of the film overlying said selected areas of the glass surface.

5. The method of claim 1, wherein said stain-producing cations are selected from the group consisting of silver, copper, gold, and thallium ions.

* * * * *